(12) United States Patent
Corrigan et al.

(10) Patent No.: US 9,593,997 B2
(45) Date of Patent: Mar. 14, 2017

(54) SELF-LOCKING MODULAR PRESSURE CONTROLLER/CALIBRATOR

(71) Applicant: Fluke Corporation, Everett, WA (US)

(72) Inventors: Christopher D. Corrigan, Seattle, WA (US); Simon J. Page, Snohomish, WA (US)

(73) Assignee: Fluke Corporation, Everett, WA (US)

( * ) Notice: Subject to any disclaimer, the term of this patent is extended or adjusted under 35 U.S.C. 154(b) by 238 days.

(21) Appl. No.: 14/455,768

(22) Filed: Aug. 8, 2014

(65) Prior Publication Data

US 2016/0041059 A1 Feb. 11, 2016

(51) Int. Cl.
| | |
|---|---|
| *G01L 27/00* | (2006.01) |
| *F16B 21/07* | (2006.01) |
| *H05K 5/00* | (2006.01) |
| *H05K 7/14* | (2006.01) |

(52) U.S. Cl.
CPC .......... *G01L 27/005* (2013.01); *F16B 21/071* (2013.01); *F16B 21/073* (2013.01); *H05K 5/0065* (2013.01); *H05K 7/1404* (2013.01)

(58) Field of Classification Search
CPC .. H05K 5/0065; H05K 5/0291; H05K 7/1404; H05K 7/1474; F16B 21/071; F16B 21/073; F16B 21/075; G01L 27/005
USPC ............................................... 211/90.1, 70.6
See application file for complete search history.

(56) References Cited

U.S. PATENT DOCUMENTS

| | | | | |
|---|---|---|---|---|
| 2,765,581 A | * | 10/1956 | Adler | A63H 33/101 403/231 |
| 4,436,269 A | * | 3/1984 | Dirksing | E03D 9/032 248/214 |
| 4,483,178 A | * | 11/1984 | Miille | G01D 5/42 361/679.31 |
| 4,753,105 A | * | 6/1988 | Juanarena | G01L 19/0015 73/1.62 |
| 4,986,674 A | | 1/1991 | Decker et al. | |
| 5,579,244 A | | 11/1996 | Brown | |
| 6,431,373 B1 | * | 8/2002 | Blick | B25H 3/003 206/378 |
| 6,637,605 B2 | * | 10/2003 | Ernst | B25H 3/003 206/378 |
| 7,184,806 B2 | | 2/2007 | Bae | |

(Continued)

FOREIGN PATENT DOCUMENTS

JP 08178788 A * 7/1996

OTHER PUBLICATIONS

"Calibration of Pressure Gauges," Reotemp Instruments, retrieved from www.reotemp.com/pdf/manual/CPGINST.0105.pdf, on May 13, 2015, 3 pages.

(Continued)

*Primary Examiner* — Daniel J Colilla
(74) *Attorney, Agent, or Firm* — Seed IP Law Group LLP

(57) ABSTRACT

A pressure controller/calibrator has multiple modules. Each module has a stage, an elongated rail fixed to chassis of the controller or the module, and resilient guides fixed to the other of the stage or the chassis. In one embodiment, the rail has a proximate end at an edge of the chassis and a distal end inside the chassis. The distal end of the rail wider is than its proximate end. Between the two ends, the rail has concave contours that cooperate with convex springs in the stage to hold the stage at a desired location in the chassis.

23 Claims, 9 Drawing Sheets

(56) References Cited

U.S. PATENT DOCUMENTS

| | | |
|---|---|---|
| 8,321,059 B2 | 11/2012 | Carter et al. |
| 8,469,047 B2 | 6/2013 | Delajoud et al. |
| 8,475,047 B2 | 7/2013 | Chang |
| 2005/0250563 A1 | 11/2005 | Nan |
| 2007/0155447 A1 | 7/2007 | Gordecki |
| 2009/0082074 A1 | 3/2009 | Chen |
| 2009/0149230 A1 | 6/2009 | Ruan |
| 2010/0304802 A1 | 12/2010 | Chuang et al. |
| 2014/0160349 A1* | 6/2014 | Huang ............... H04N 5/2252 348/375 |

OTHER PUBLICATIONS

"CPC6000 Modular Precision Pressure Controller," Mensor, Data Sheet CT 27.61, 2015, 8 pages.

"High-End Pressure Controller Model CPC8000," Mensor, Data Sheet CT 28.01, 2015, 8 pages.

"PACE Modular Pressure Controller," General Electric, 2011, 8 pages.

"Procedure for Calibrating Pressure Transducers," United States Department of the Interior—Bureau of Reclamation, USBR 1050-89, retrieved from www.usbr.gov/...2/USBR1050,pdf, on May 13, 2015, 4 pages.

\* cited by examiner

SELF-LOCKING MODULAR PRESSURE CONTROLLER/CALIBRATOR

BACKGROUND

Chemical and pharmaceutical processing plants use smart devices to monitor pressure during process operations. Smart devices are precisely calibrated with a pressure controller/calibrator before they are installed in a manufacturing process. Smart devices for sensing pressure have two key items to be calibrated. The first and foremost item is calibrating the pressure-to-resistance (or pressure-to-voltage) relationship of the transducer, and the second item is calibrating the linearity and offset of the conversion of electrical signal from the transducer into a 4-20 milliamp signal. Calibrating the transducer requires a pressure source such as a reference pressure source or a handheld pump and a precision pressure controller/calibrator.

A smart device has one or more transducers that measure physical parameters, such as pressure or temperature or whether a valve is open or closed. Transducers convert a signal of parameters in one form of energy (e.g., pressure, flow) into electrical signals. The output of the transducer is converted from analog to digital values by an analog-to-digital converter whose output is input to a microprocessor. Some smart devices may have a microprocessor and circuitry for performing A-to-D and D-to-A conversion in a single chip. Depending upon the type of communication network, after processing, the microprocessor output may be converted into an analog value for transmission via a wired or wireless transmitter.

If the transducer is out of tolerance, the span and offset may have to be adjusted on the smart device. If the transmitter uses a digital communication protocol the span and offset is adjusted through a digital communicator or with a documenting process calibrator capable of digital communication. Otherwise, trim pots on the transmitter are used to adjust the span and offset. The need to achieve consistent results is one of the most important reasons for calibration.

Process plants may have hundreds of pressure measuring stations with each station having a pressure transducer/transmitter to sense pressure at the station and communication channels to send the pressure data to a central monitor. Field calibration equipment may calibrate the smart devices while they are in use. However, smart devices wear, become damaged and fail. When that occurs they must be taken out of service, repaired or replaced, and calibrated with a laboratory calibrator also known as a pressure controller/calibrator. New and repaired smart devices undergo a highly precise calibration procedure using a laboratory pressure controller/calibrator. Because of the large number of smart devices requiring laboratory calibration, it is desired to provide a pressure controller/calibrator that can easily connect and disconnect the smart devices under test (DUT) to precise pressure standards for performing calibration operations on the DUTs.

Current pressure controller/calibrators have one or more pressure standard stations in the controller. Each pressure standard station has a highly precise pressure transducer. The laboratory calibrator compares readings of a pressure source sensed by the highly precise pressure transducer and the transducer of the smart device. However, each pressure standard station has a limited range, e.g., 0-100 psi, 200-300 psi, 500-1,000 psi, etc. A pressure controller/calibrator may have one or two pressure standard stations in the pressure controller. However, each pressure standard can only calibrate a limited pressure range. Real world processing operations have a large range of operating pressures but pressure standard stations have limited ranges. In order to accommodate the variety of pressure ranges, process operators may need a large number of pressure controller/calibrators, each having one or two pressure standard stations dedicated to one or two predetermined ranges. As such multiple pressure controllers are needed to calibrate the variety of smart devices that span the large number of pressure ranges.

Others have proposed modular pressure standard stations for pressure controllers/calibrators with the goal of swapping pressure standards with different pressure ranges into and out of a common pressure controller. However, such known modular pressure stations require an operator to substantially disassemble the pressure controller in order to interchange modular pressure stations. More specifically, a user has to individually connect and individually disconnect each pneumatic and electrical connection between the modular pressure station and the chassis of the pressure controller. If the module is not properly aligned, the fittings or the chassis may be damaged. Modular pressure standard stations have threaded connections to the chassis and the threads may become crossed or damage the module, the controller, or both. Fittings can also be damaged if the module is connected with too much torque. In conventional modular systems, data associated with the pressure standard module is stored in a central location in the pressure controller and is lost when one module is swapped for another.

The foregoing problems have generated a need for a more efficient modular pressure controller/calibrator that enables an operator to more quickly connect and disconnect the pressure standard modules with the chassis and a module that prevents damage to the module and the controller and prevents loss of the data associated with each pressure standard module.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Embodiments of the modular pressure controller comprise a chassis and one or more pressure standard modules that easily and reliably connect and disconnect with the chassis. The embodiments achieve their goals by providing a stage, an elongated rail fixed to one of the chassis or the stage, and resilient guides fixed to the other of the stage or the chassis. The rail has a proximate end at an edge of the chassis and a distal end inside the chassis. The distal end of the rail is wider than its proximate end. The distal end of the rail also has contours that cooperate with the stage to hold the stage at a desired location in the chassis. The relatively narrow width of the rail at its proximate end, at the edge of the chassis, provides an initial gross alignment that becomes more precise as the stage travels along the rail.

Edges of the rail have concave contours that mate with corresponding convex contours on resilient guides. The contours on the rail and the resilient guides cooperate to align the stage relative to the chassis and to laterally and vertically precisely position the stage with respect to fittings in the chassis. As the stage passes over the rail, the resilient guides bear against the sides of the rails to align the stage with the distal fittings as the stage moves along the length of the rail. The stage is brought to a soft but firm stop where fittings on the stage almost touch corresponding fittings on the chassis. Inlet and vent port fittings of the chassis simultaneously engage corresponding fittings in the stage by operation of an axial thumb screw. The thumb screw has a torque-limiting knob.

In certain embodiments, the rail is fixed to the chassis and the resilient guides are fixed to the stage. In other embodiments, the rail is fixed to the stage and the resilient guides are fixed to the chassis. The convex resilient guides may be springs biased against the edges of the rail for guiding the stage along the rail and engaging the concave contours on the edges of the rail to limit passage of the stage. In particular, the springs may comprise a yoke disposed transverse to the rail. The yoke has first and second opposite ends that extend beyond the edges of the rail. The ends of the yoke attach to the springs. The springs may be flat springs or leaf springs with contours that are complementary to (or equal and opposite to) the contours of the rail. For example, where the rail may have symmetrical concave contours on its edges, the flat springs have convex contours that engage the concave contours of the rails. Travel of the stage along the rail is arrested and resisted when the convex springs engage the concave contours of the rail.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
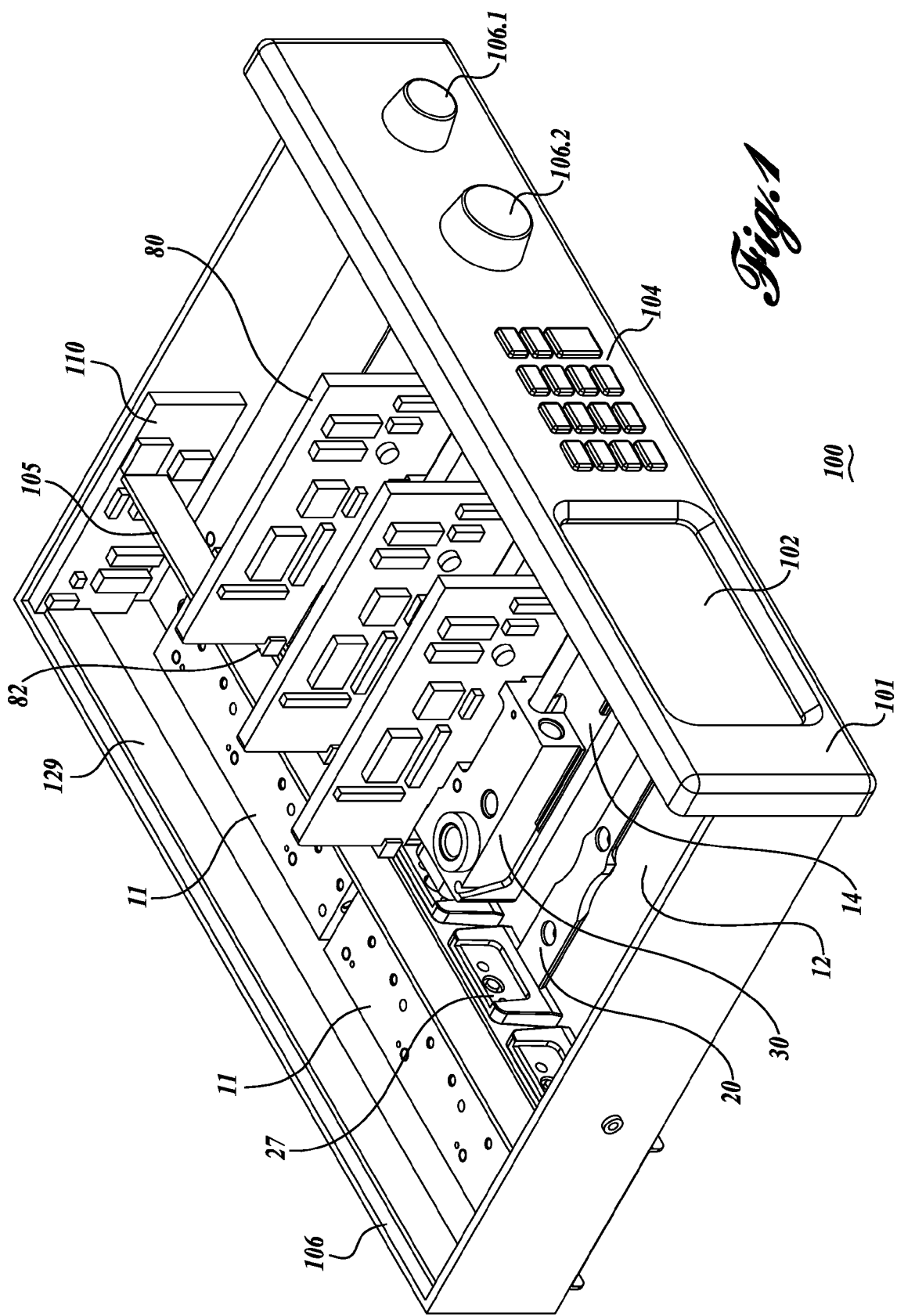
FIG. 1 is a frontal perspective view representing a modular pressure controller/calibrator with a top cover removed.
Figure 2:
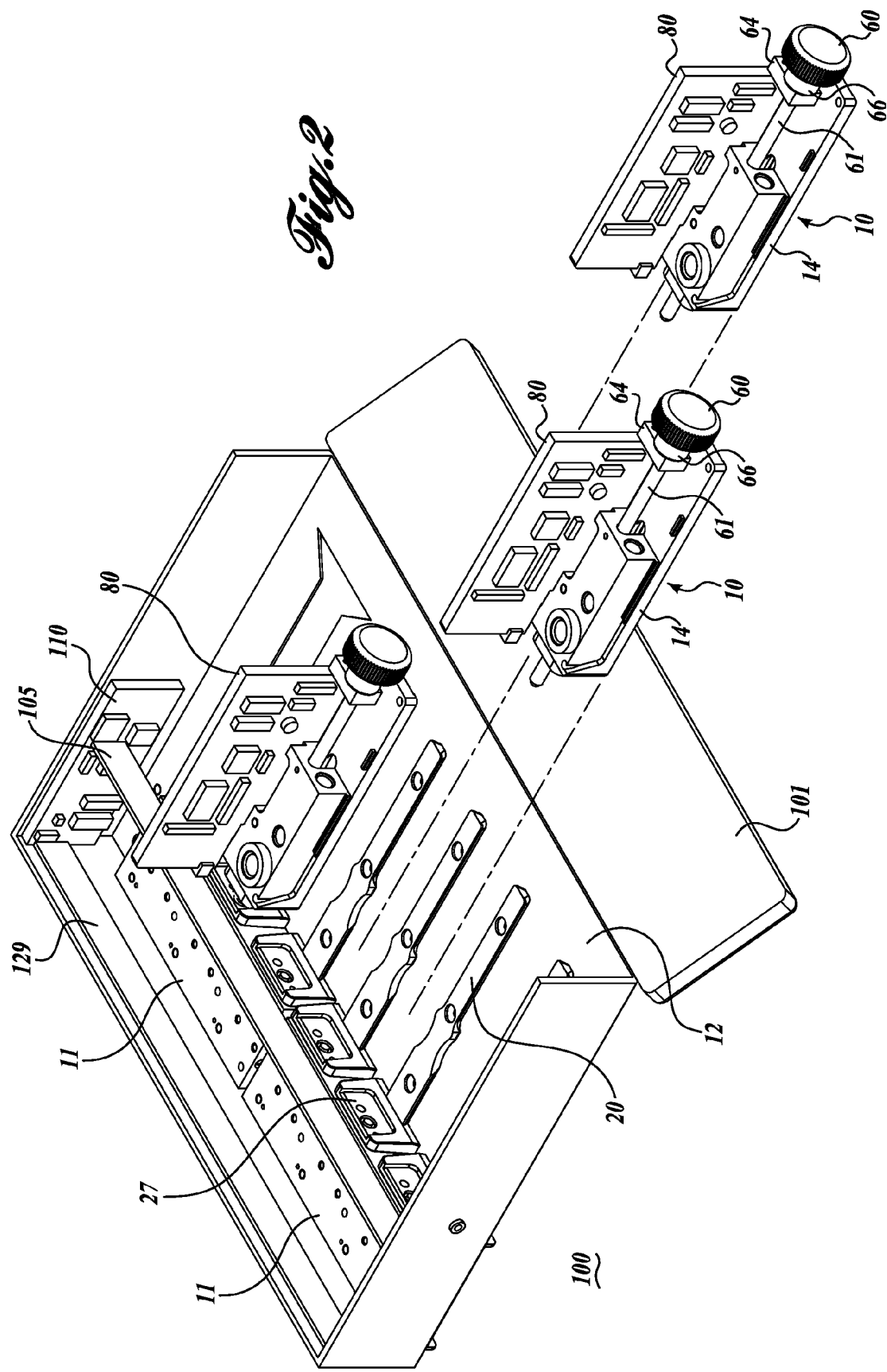
FIG. 2 is a partially exploded frontal view representing a modular pressure controller/calibrator as shown in FIG. 1.
Figure 3:
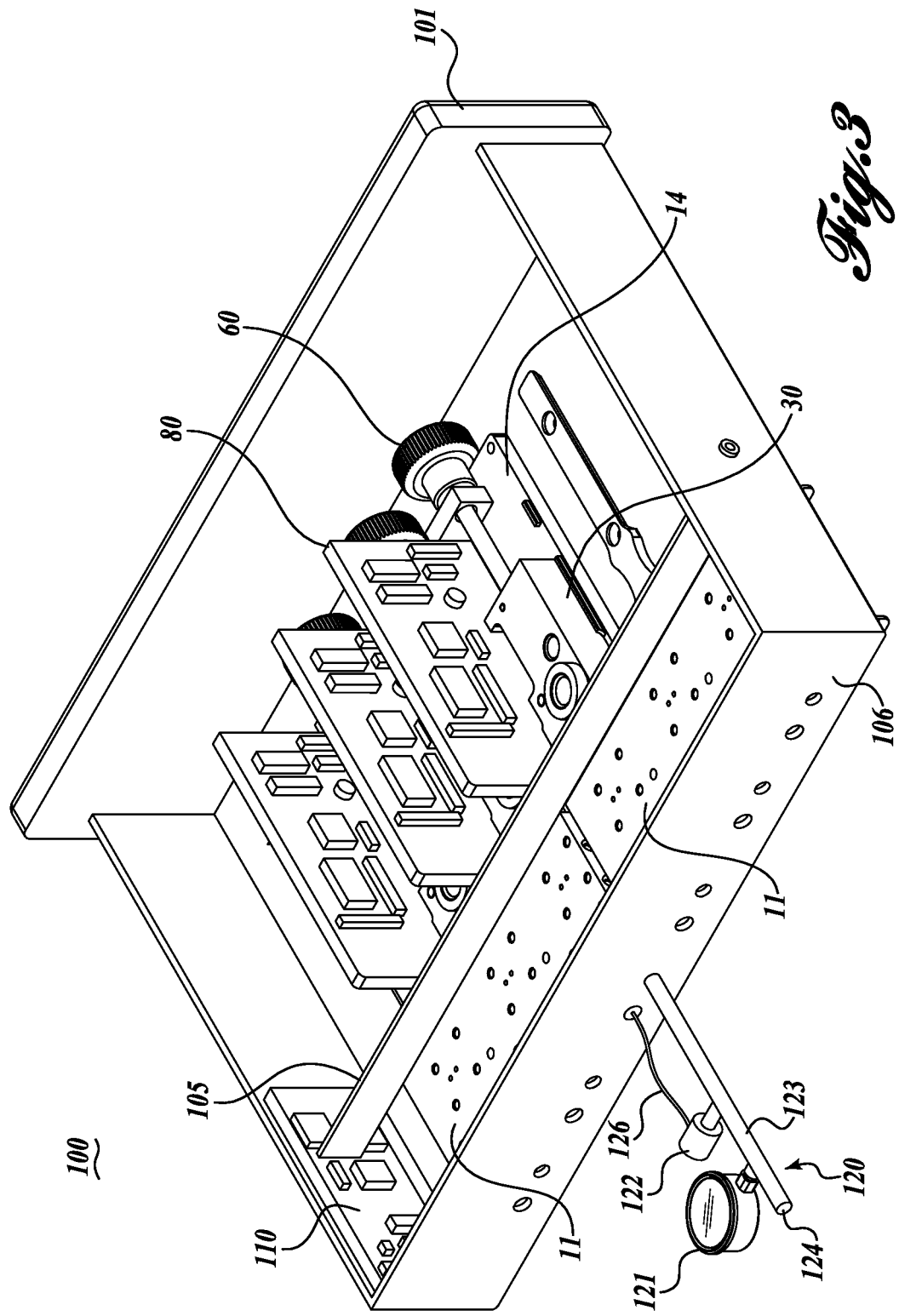
FIG. 3 is rear perspective view representing a modular pressure controller/calibrator as shown in FIG. 1.

FIGS. 1-3 show an embodiment of a modular pressure controller/calibrator 100 and number of pressure standard modules 10. The top cover of the pressure controller/calibrator 100 (also referred to as a pressure controller 100) and the individual covers of the modules 10 are omitted for purposes of illustrating certain features of embodiment shown. Pressure controller 100 has a chassis 12 between front and rear panels 101, 106. A plurality of guide rails 20 are fixed to the chassis 12. Each guide rail 20 may have a pressure standard module 10. Manifolds 11 extend from the rear panel 106 to one end of the guide rails 20. The other ends of the guide rails 20 are adjacent the front panel 101. Pressurized air or other sources of pressurized fluid (not shown) are connected to manifolds 11 via ports in the rear panel. Front panel 101 has a display 102, functional keys 104, and knobs 106.1, 106.2 for operating the pressure controller 100. An electrical bus 105 extends the width of the chassis 12. A system controller 110 is connected to the bus 105, the display 102, the functional keys 104, and the knobs 106.1, 106.2 for operating the pressure controller 100 and the modules 10. Each module 10 has a printed circuit board 80 with signal processing, memory, and an input/output port 82, and is connected to the bus 105 to enable the system controller 110 to control operation of each module 10.

The pressure controller 100 permits a user to rapidly swap one pressure standard module 10 for another. Turning to FIG. 2, the front panel 101 is hinged to the chassis 12 and is rotated to an open position. When panel 101 is open, an operator may rapidly insert and remove a pressure standard module 10 on the chassis 12 using a guide rail 20 and resilient guide 31 disposed on the bottom surface of module 10. Each module 10 has an elongated thumbscrew 6 with a knob 60 and an elongated shaft with a threaded end 62 to secure the pressure standard module 10 in a fluid-tight seal with a fluid connection on the manifold 11.

Turning to FIG. 3, a device under test (DUT) 120 is smart device in the form of a pressure transducer/transmitter. It has a conduit 123 with a plugged end 124 and another end 125 that is connected to a pressure port on the rear panel 106. That pressure port is connected to a manifold 11. DUT 120 has a pressure gauge 121 and a pressure transducer/transmitter 122 connected to the conduit 123. An electrical cable 126 connects the output of the pressure transducer 122 to a second bus 129 on the inside surface of rear panel 106. Bus 129 is also connected to the system controller 110. Data from DUT 120 and control signals from system controller 110 travel over bus 129. The pressure controller 100 applies the same pressure to the DUT 120 as to one of the modules 10 and compares the output readings of pressure from DUT 120 to the output readings of pressure made by the precise pressure transducer 73 (see FIG. 4) carried in the module 10.

Figure 4:
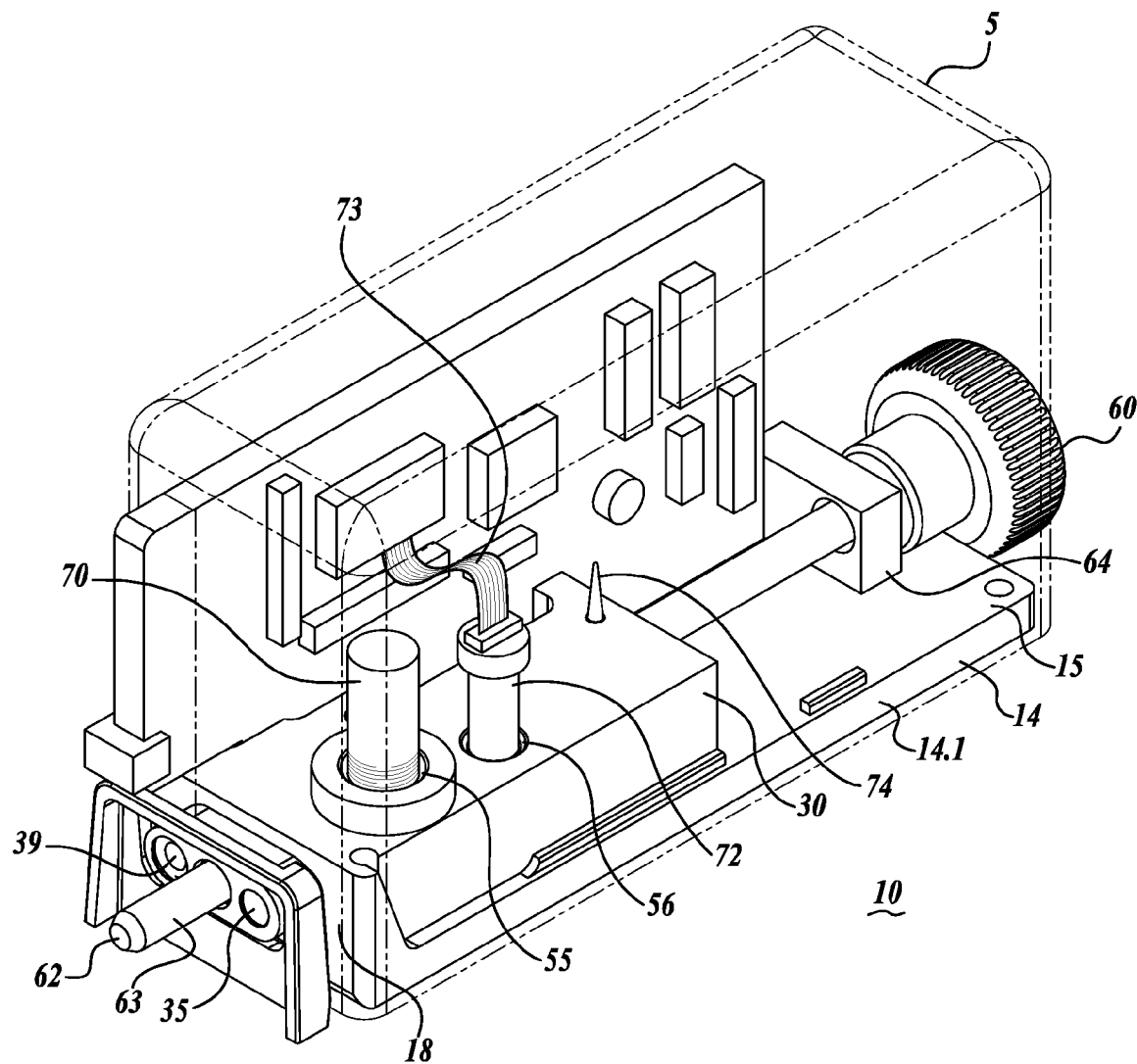
FIG. 4 is a frontal and side perspective view representing a pressure standard module with a relief valve and a precision pressure transducer.
Figure 5:
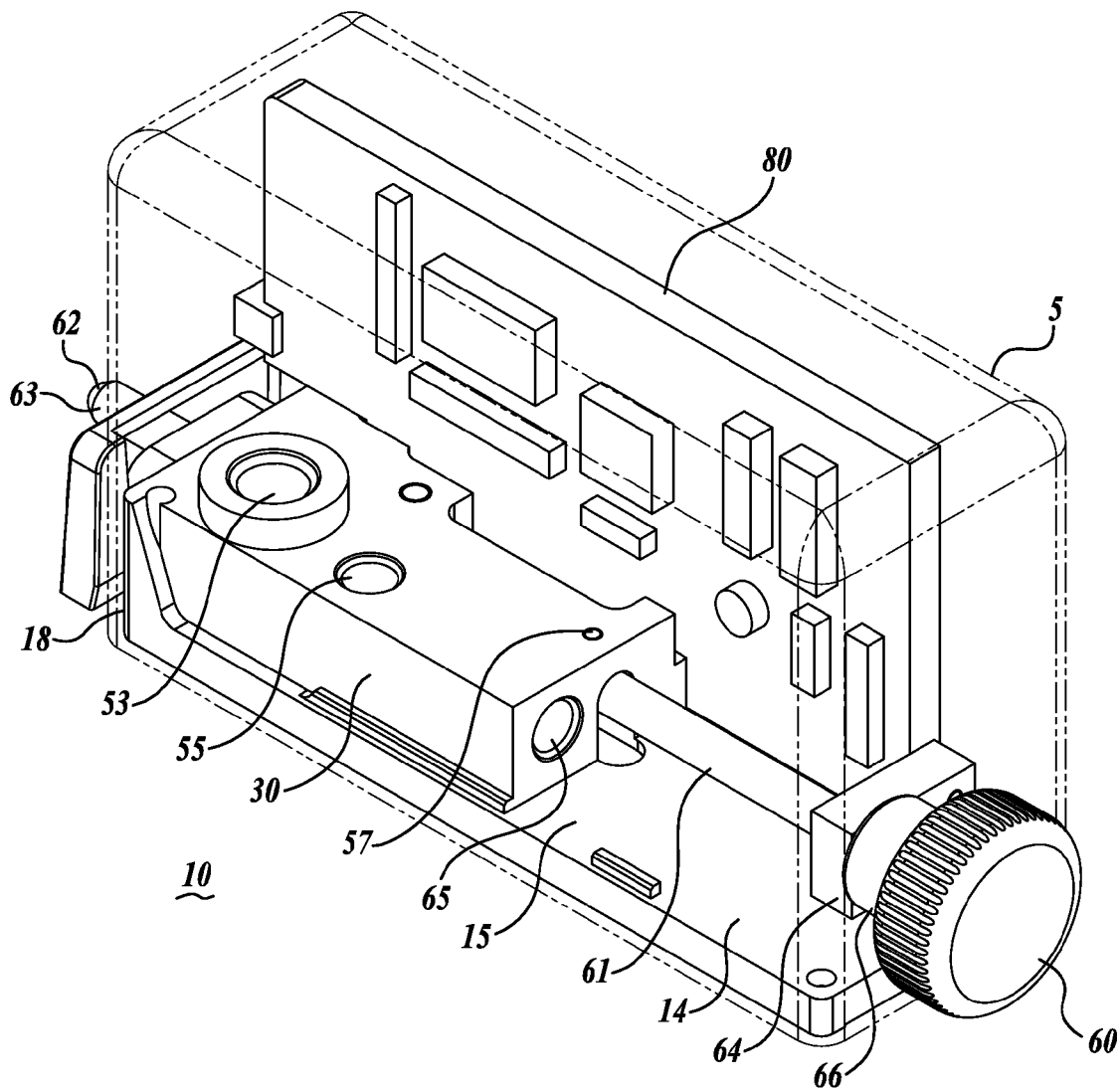
FIG. 5 is a frontal and side perspective view corresponding to FIG. 4 without the relief valve precision pressure transducer.
Figure 6:
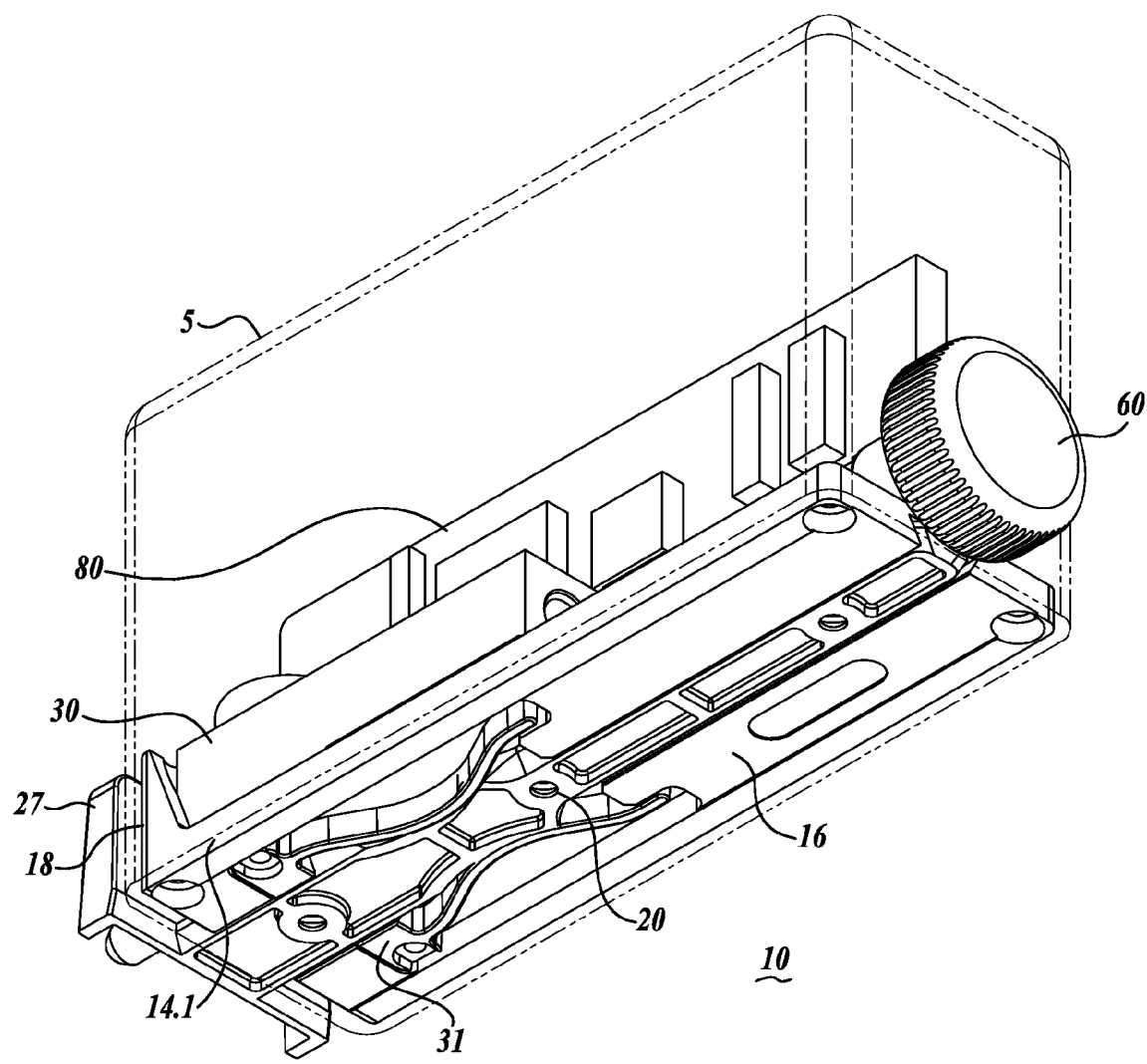
FIG. 6 is a bottom perspective view of the pressure module shown in FIG. 5.

FIGS. 4, 5 and 6 show the pressure standard module 10 that connects to the pressure manifold 11 in the chassis 12 to the system controller 110. The module 10 has a cover 5 shown in dashed lines. Module 10 aligns with contoured rail 20 that is fixed to the chassis 12. Module 10 has a stage 14 with a base portion 14.1 having a lower surface 16, an upper surface 15, a transducer block 30 on one end of the upper surface 15 and a bearing 64 on the other end of upper surface 15. Stage 14 including its base 14.1, transducer block 3, and bearing 64 are machined from a single body of aluminum, but other material could be used including iron, steel and plastic that can withstand high pressure. In other embodiments, the base 14.1, transducer block 30, and bearing 64 and separately fashioned and then assembled to form a stage 14.

Transducer block 30 has a pressure channel 35 that extends from the distal end 18 of the stage 14 and is in fluid communication with relief port 53 and transducer port 55 on the surface of transducer block 30. A vent channel 39 is parallel to channel 35. Channels 35, 39 connect to a manifold 11. The channel 35 terminates in a first bushing 46 and channel 39 terminates in a second bushing 47. Each bushing terminates in an O-ring that forms a fluid-tight connection with a corresponding bushing and O-ring on the manifold 11. To apply pressure to a transducer port 55, manifold 11, under control of the system controller 110 and control valves (not shown), closes the vent channel 39 and connects the pressure channel 35 to a source of pressure. To vent pressure, the manifold closes the pressure source from the manifold 11 and opens the vent channel 39 to release the pressure in the module 14. A pressure relief valve 70 is inserted into relief port 53 for releasing the pressure in the module 10 if the pressure exceeds a predetermined safety threshold. A highly precise pressure transducer 72 is inserted into port 55. The pressure transducer 72 generates electrical signals representative of pressure at the port 55. A ribbon cable 73 provides electrical power to the transducer and exchanges data and control information with a microcontroller on the printed circuit board 80. A temperature probe 74 from the printed circuit board 80 is inserted in a probe chamber 56 in the transducer block 30 to measure its temperature.

Thumbscrew 6 operates to establish a fluid-tight connection between the manifold 11 and the ports 35, 39 in transducer block 30. Thumbscrew 6 has a knob 60 that turns an elongated shaft 61 with a threaded end 62 surrounded by a spring-loaded protective bushing 63. As the shaft 61 screws into the manifold 11, the bushing 63 retracts. Bushing 63 mutually protects the manifold 11 and the threaded end of the shaft 61. At the proximate end of stage 14, shaft 61 is supported by a bearing 64 with a shaft aperture 66. At the distal end of stage 14, shaft 61 extends through elongated passage 65 in the transducer block 30. The knob 60 connects to the shaft 61 with a torque-limiting clutch 66 which automatically slips when torque applied to the shaft exceeds a predetermined limit. Such torque-limiting devices are well known and the fuel cap on most automobiles is exemplary of such devices. By limiting torque on the shaft 61, the embodiment 100 prevents a user from over-tightening the shaft 61 into the manifold 11 and damaging the manifold or the shaft.

Figure 7:
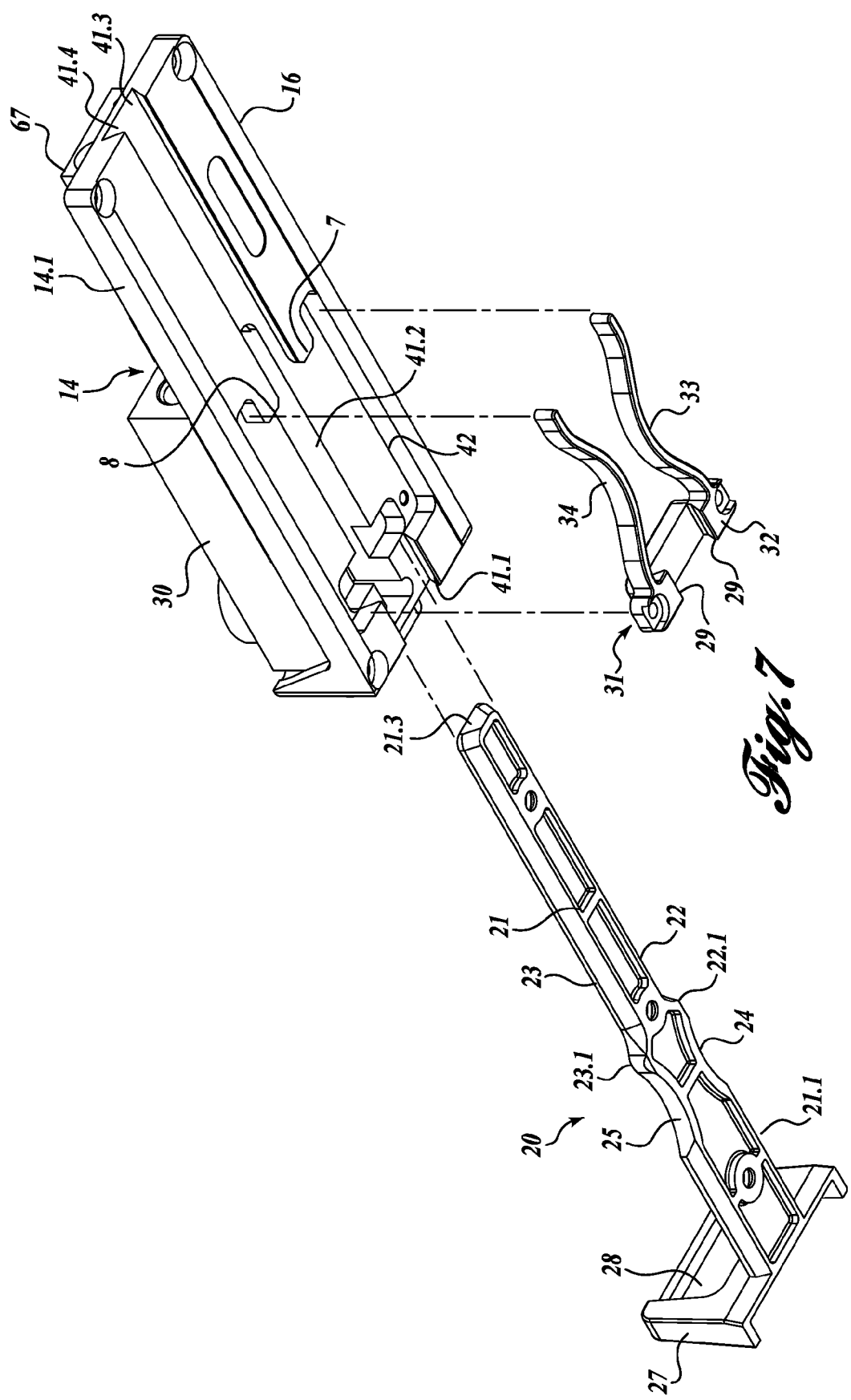
FIG. 7 is an exploded and partial perspective view of a guide rail aligning with a stage of a pressure module.
Figure 8:
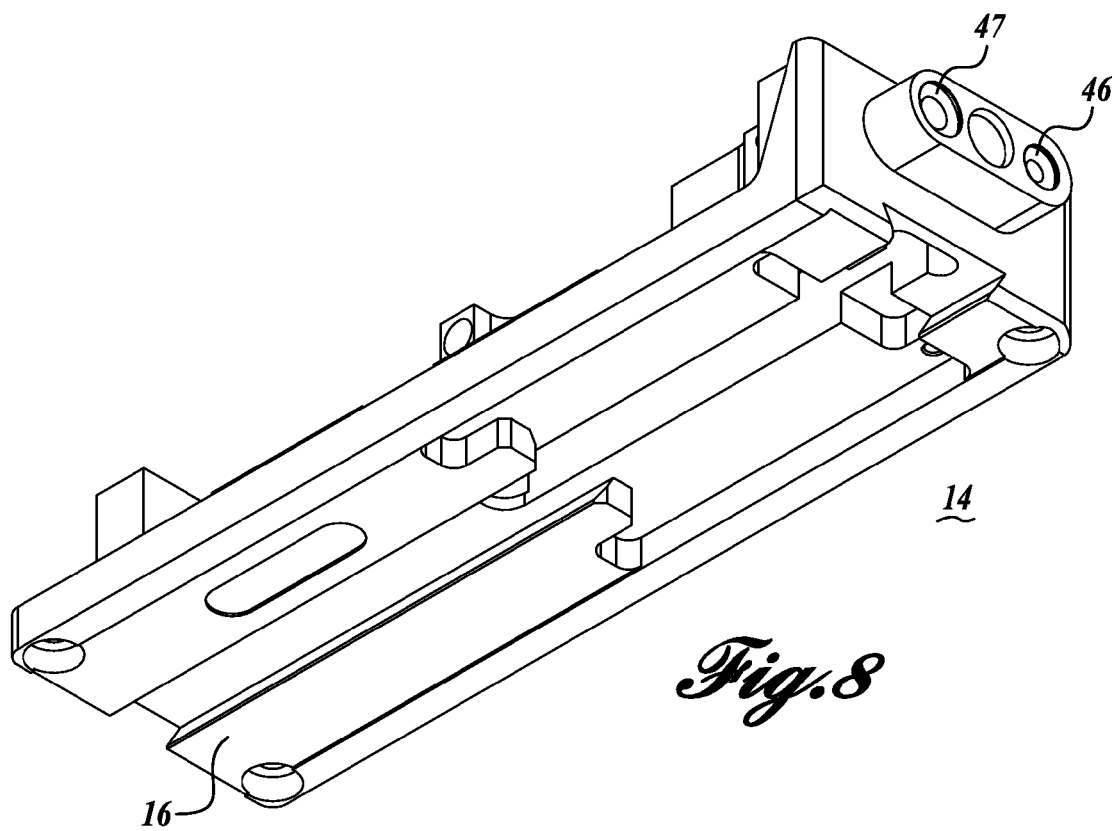
FIG. 8 is a perspective view of the bottom of a stage of a pressure module.
Figure 9:
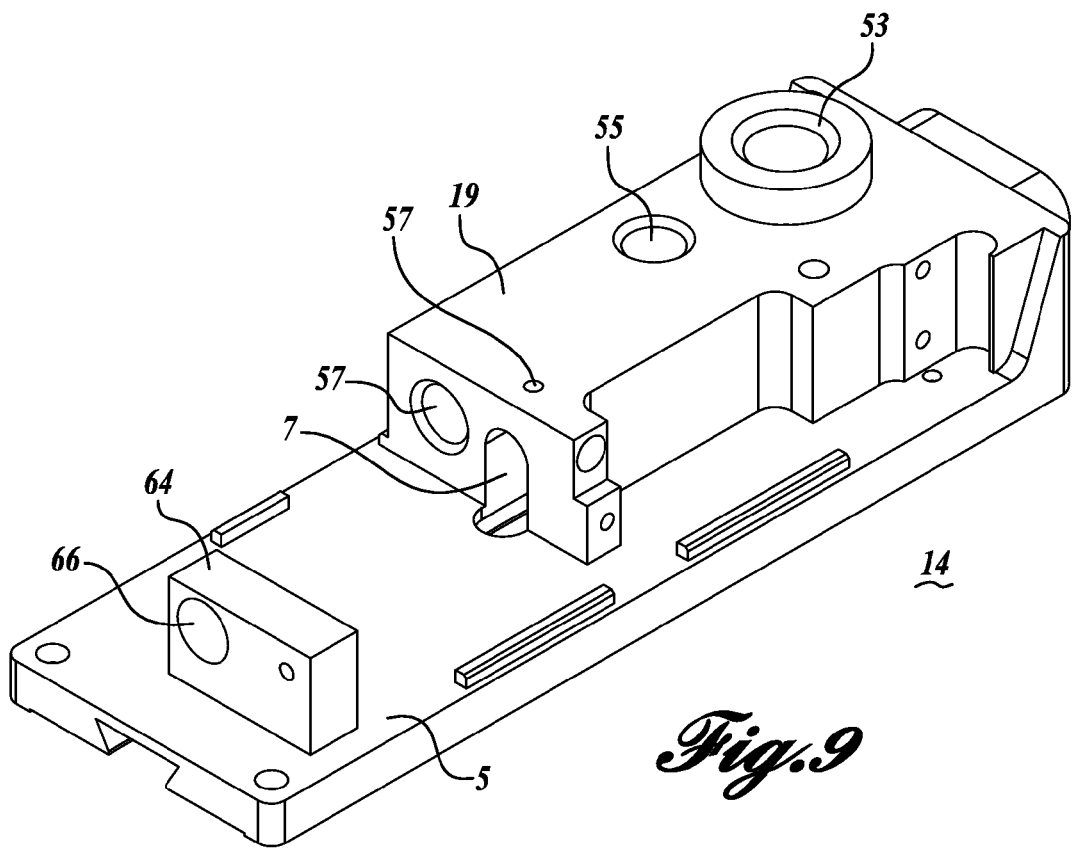
FIG. 9 is a perspective view of the top a stage of a pressure module.
Figure 10:
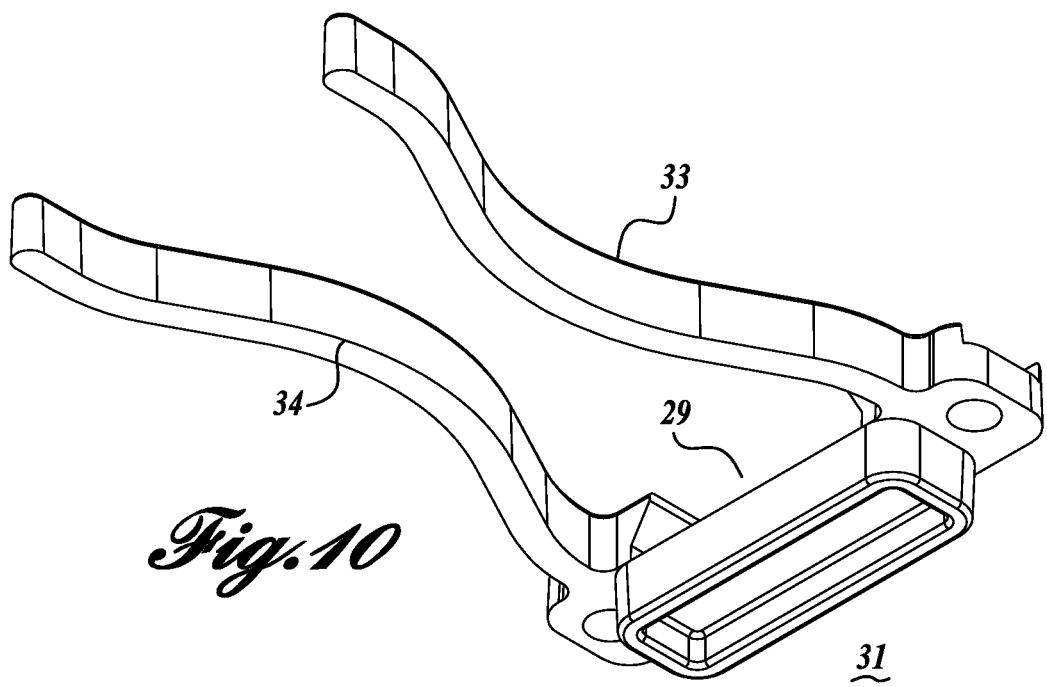
FIG. 10 is a bottom perspective view of a resilient guide.
Figure 11:
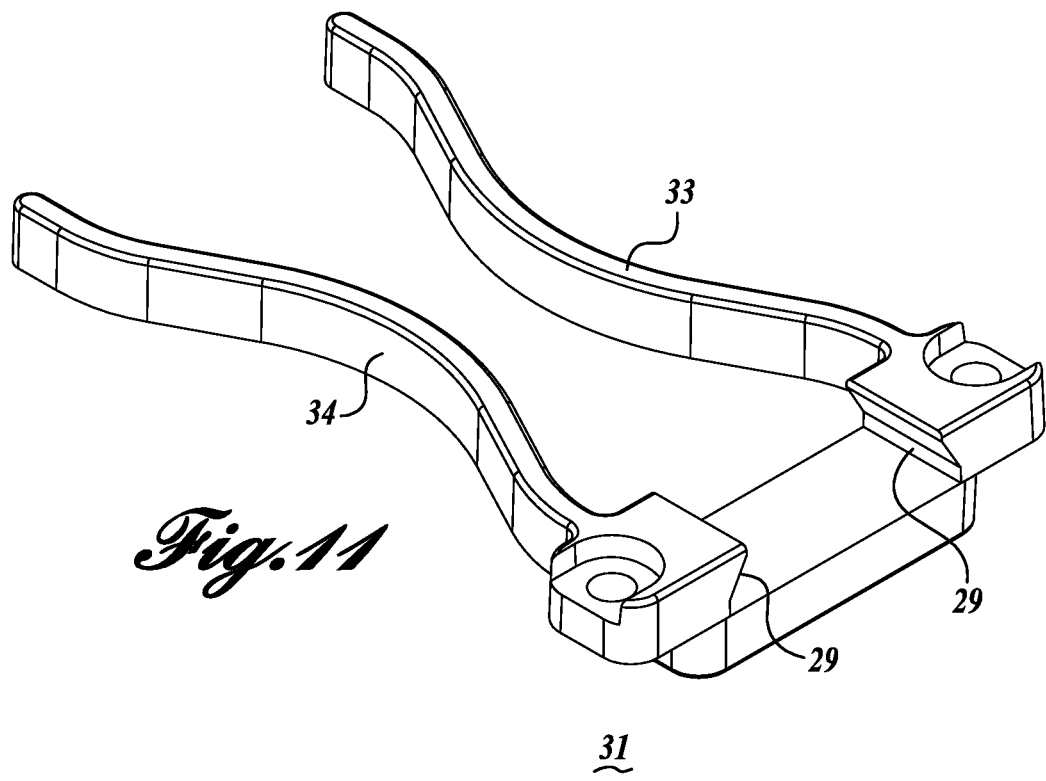
FIG. 11 is a top perspective view of the resilient guide of FIG. 10.

FIG. 7 shows how a guide rail 20 mates with the module 10. The guide rail 20 is made of plastic or of metal, such as aluminum, iron, or steel. Guide rail 20 may be fabricated by machining a sheet of material or by casting or molding material to a desired shape. It has an elongated body 21 with opposite edges 22, 23. Rail body 21 has three portions: a distal portion 21.1, and intermediate portion 21.2, and a proximate portion 21.3. Proximate portion 21.3 is the longest and narrowest portion of rail 20 and has straight, parallel edges. Intermediate portion 21.2 has its edges farther apart than the proximate portion 21.3, has relatively short curved portions 22.1, 23.1 that bend outward and away from the axis of the rail 20 and longer curved portion 24, 25 with concave surfaces that bend initially toward the axis of the rail 20 and then away from it. Distal rail portion 21.1 has parallel and straight edges and is the widest portion of the rail 20. The narrow proximate portion 21.3 easily fits into a relatively wide slot on the bottom surface of the stage 14. Distal portion 21.1 of rail 20 has a stage stop 27 that prevents further travel of the stage 14 along the rail. Stage stop 27 has an opening 28 to allow bushings and connectors on the end of the stage 14 to engage corresponding bushings and connectors on the chassis 12.

Stage 14 is generally rectangular in shape. Lower surface 16 of base 14.1 has a central slot 41. Slot 41 has three sections, including a distal section 41.1, an intermediate section 41.2 and a proximate section 41.3. Sections 41.1 and 41.3 have a keyed profile with a relatively narrow width at the lower surface 16 and terminating at a ceiling 41.4 that is wider than the opening at the lower surface 16. Intermediate slot section 41.2 is wider than either section 41.1, 41.3 and holds resilient guide 30. Distal slot section 41.1 is wider than proximate section 41.3. The wide distal slot 41.1 section will first engage the narrower proximate portion 21.3 of the guide rail 20. The relative difference in widths of the slot section 41.1 and the rail portion 21.3 allows a user to initially easily align the stage 14 with the guide rail 20.

Recess 42 is has a generally rectangular shape. The recess 42 holds the resilient guide 31 which has a yoke 32 and two prongs 33, 34. The yoke 32 is oriented transverse to the rail 20 and has a central recess 29 to permit travel of the yoke 32 over rail 20. Prongs 33, 34 extend from opposite ends of the yoke 32 and have a convex shape for engaging the corresponding concave contours 24, 25 in the rail 20. The ends of the prongs distal from the yoke 32 are laterally restrained by lobes 7, 8 that protrude into the recess 42 on opposite sides of slot section 41.2. The resilient guide 31 may be made of metal, plastic or any other suitable resilient material. The resilient guide 31 may be made of one material or use different materials for the yoke 32 and the prongs 33, 34. The prongs 33, 34 are resilient for bearing against the edges 22, 23 of the rail 20, but the yoke 32 may be rigid.

A pressure standard module 10 is installed in a pressure controller 100 by rotating the front panel 101 to expose the chassis 12. If no guide rail 20 is available, one of the installed modules 10 is removed to make room for the new module. If a guide rail 20 is available, a module 10 is arranged so that the distal section 41.1 of slot 41 on the bottom surface 16 is preliminarily aligned with the proximate portion 21.3 of a rail 20. An installer pushes the module 10 along the rail 20. The convex surfaces of the prongs 33, 34 of the resilient guide 30 initially engage the parallel, straight edges of the rail portion 21.3. The resiliency of the prongs is chosen so that only a moderate force is needed to slide the stage 14 along the rail 20. Prongs 33, 34 move along the rail 20 and approach the intermediate portion 21.2 of the rail 20 where bumps 22.1, 23.1 engage the prongs 33, 34. More force is needed to compress prongs 33, 34 in order to move the stage 14 past the bumps 22.1, 23.1. The amount of force required to move the stage will increase until the convex surfaces of the prongs 33, 34 are half way past the bumps 22.1, 23.1. Thereafter the force will lessen and the prongs 33, 34 will slide into and lock with the concave surfaces of the intermediate portion 21.2 of the rail 20. As that occurs, the distal section 41.1 of the slot in the stage 14 will slide against the edges of the rail in distal portion 21.1. The stop 27 of the rail 20 limits further travel of the stage and the opening 28 in the rail permits bushings on the end of the stage to engage corresponding bushings in the manifold 11.

The module 10 is firmly locked in a pressure tight seal with the manifold by turning thumbscrew knob 60 until its torque limiting clutch releases. Some embodiments have pressure bushings on the stage 14 and the manifold 11 that are opposite each other. The bushings have O-rings in their respective ends. The rail 20 and the stage are sized so that the opposite O-rings almost touch or touch with only slight pressure. By virtue of the rail 20 and stage 14, the threaded end of thumbscrew shaft 61 is aligned with a threaded opening in the manifold 11. Turing the thumbscrew 4 advances the stage to engage the opposing O-rings and bring them into a pressure-tight seal with each other. Removal of a module 10 is made by unscrewing the thumbscrew from the manifold 11 and pulling the module 10 along the rail 20.

The foregoing detailed description is intended to be illustrative of the embodiments of the invention and should not be used to limit the scope of the claims. Other embodiments are deemed within the scope of the claims. For example, although the transducer block 30 is made of a one piece of material, it could be made of multiple pieces that are assembled together. While some embodiments dispose the guide rails on the chassis and the resilient clip in a recess in the module 10, other embodiments could fashion the guide rail as part of the module 10 and dispose the recess and the springs in the chassis.

While illustrative embodiments have been illustrated and described, it will be appreciated that various changes can be made therein without departing from the spirit and scope of the invention.

The embodiments of the invention in which an exclusive property or privilege is claimed are defined as follows:

1. A modular system comprising:
    a chassis;
    a stage;
    an elongated rail fixed to one of the chassis or the stage for guiding the stage, said rail having a longitudinal axis and contours on edges of the rail; and
    a yoke and two resilient prongs fixed to the other one of the chassis or the stage, the yoke disposed transverse to the longitudinal axis of the elongated rail and extending beyond the edges of the rail, wherein the two resilient prongs extend away from the yoke along the longitudinal axis of the rail, the resilient prongs having a length that is longer than the length of the yoke along the longitudinal axis, and wherein the resilient prongs are biased against the edges of the rail for guiding the stage along the rail and for engaging the contours on the edges of the rail to limit passage of the stage.

2. The modular system of claim 1, wherein the rail is fixed to the chassis and the resilient guides are fixed to the stage.

3. The modular system of claim 1, wherein the rail is fixed to the stage and the resilient guides are fixed to the chassis.

4. The modular system of claim 1, wherein the contours are symmetrical.

5. The modular system of claim 1, wherein the rail contours are concave and the resilient prongs have contours that are convex.

6. The modular system of claim 1, wherein the rail comprises a stop oriented transverse to the length of the length of the rail and disposed at one end of the rail for arresting motion of the yoke.

7. The modular system of claim 1, wherein the resilient prongs are flat springs.

8. A modular pressure controller/calibrator comprising:
    a chassis;
    an elongated rail for guiding a pressure standard stage, said rail having contours on edges of the rail and fixed to the chassis;
    a pressure standard stage having an upper and a lower surface, at least one slot along the lower surface to receive the rail and guide the stage relative to the chassis, and a recess in the stage lower surface at a distal end of the stage, said recess disposed across the slot; and
    resilient guides in the recess and bearing against the edges of the rail for guiding the stage along the rail and engaging the contours on the edges of the rail to limit passage of the stage.

9. The modular pressure controller/calibrator of claim 8, wherein the stage has a longitudinal conduit with an inlet port at a distal end of the stage and extending from said distal end toward a proximate end of said stage and a transverse conduit intersecting the longitudinal conduit and having an outlet port at the upper surface of the stage for receiving a pressure transducer.

10. The modular pressure controller/calibrator of claim 8, wherein the slot along the surface of the stage has a keyed profile along its length.

11. The modular pressure controller/calibrator of claim 10, wherein the keyed profile extends from the lower surface of the stage toward a ceiling disposed below the upper surface of the stage, wherein the keyed profile is wider at the ceiling than at the lower surface.

12. The modular pressure controller/calibrator of claim 8, wherein the stage has at least one inlet port and the rail has a frame at one end with an opening for allowing passage of the inlet port and limiting further travel of the stage.

13. The modular pressure controller/calibrator of claim 8, wherein the stage comprises an axial locking shaft having a threaded end extending beyond the stage for engaging a corresponding threaded aperture in the chassis and the other end of the axial locking shaft having a thumb screw for advancing the axial locking shaft to engage the threaded aperture of the chassis.

14. The modular pressure controller/calibrator of claim 13, wherein the thumb screw has a clutch for releasing the thumb screw from axial locking shaft when the torque applied to the axial shaft exceeds a predetermined torque.

15. The modular pressure controller/calibrator of claim 8, wherein the resilient guides are flat springs.

16. The modular pressure controller/calibrator of claim 8, wherein the stage includes at least one pressure transducer and a controller for controlling and recording data associated with calibration performed with the pressure transducer.

17. The modular pressure controller/calibrator of claim 16, wherein the chassis has a pressure manifold and one or more manifold pressure ports, the stage has at least one inlet port for connecting to at least one manifold pressure port of the chassis, and a channel connects the at least one inlet port of the stage to the at least one pressure transducer.

18. The modular pressure controller/calibrator of claim 17, wherein the stage further comprises electrical control circuitry for conducting a calibration of a pressure transducer on a device coupled to the at least one manifold pressure port of the chassis and the chassis has a control port for exchanging data and control signals with the electrical control circuitry of the stage.

19. A modular pressure controller/calibrator comprising:
    a chassis;
    an elongated rail for guiding a pressure standard stage, said rail having contours on edges of the rail and fixed to a lower surface of the pressure standard stage;
    wherein the chassis has at least one slot along a surface to receive the rail and guide the stage relative to the chassis, and a recess in the surface at a distal end of the chassis, said recess disposed across the slot; and
    resilient guides in the recess and bearing against the edges of the rail for guiding the stage and engaging the contours on the edges of the rail to limit passage of the stage.

20. The modular pressure controller/calibrator of claim 19, wherein the stage has a longitudinal conduit with an inlet port at a distal end of the stage and extending from said distal end toward a proximate end of said stage and a transverse conduit intersecting the longitudinal conduit and having an outlet port at the upper surface of the stage for receiving a pressure transducer.

21. The modular pressure controller/calibrator of claim 19, wherein the stage has at least one inlet port and the chassis has a frame at one end with an opening for allowing passage of the inlet port and limiting further travel of the stage.

22. The modular pressure controller/calibrator of claim 19, wherein the stage comprises an axial locking shaft having a threaded end extending beyond the stage for engaging a corresponding threaded aperture in the chassis and the other end of the axial locking shaft having a thumb screw for advancing the axial locking shaft to engage the threaded aperture of the chassis.

23. The modular pressure controller/calibrator of claim 19, wherein the chassis has a pressure manifold and one or more manifold pressure ports, the stage has at least one pressure transducer and at least one inlet port for connecting to at least one manifold pressure port of the chassis, and a channel connects the at least one inlet port of the stage to the at least one pressure transducer.

* * * * *